(12) United States Patent
Seo

(10) Patent No.: US 12,080,209 B2
(45) Date of Patent: Sep. 3, 2024

(54) DISPLAY APPARATUS

(71) Applicant: Samsung Display Co., Ltd., Yongin-si (KR)

(72) Inventor: Eunwon Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/187,627

(22) Filed: Mar. 21, 2023

(65) Prior Publication Data

US 2023/0343261 A1    Oct. 26, 2023

(30) Foreign Application Priority Data

Apr. 26, 2022 (KR) .......................... 10-2022-0051656

(51) Int. Cl.
| | |
|---|---|
| G09G 3/00 | (2006.01) |
| H10K 59/80 | (2023.01) |
| H10K 77/10 | (2023.01) |
| G09G 3/3208 | (2016.01) |

(52) U.S. Cl.
CPC .............. *G09G 3/035* (2020.08); *H10K 59/80* (2023.02); *H10K 77/111* (2023.02); *G09G 3/3208* (2013.01); *G09G 2300/0426* (2013.01)

(58) Field of Classification Search
CPC ................. G06F 1/1652; G06F 1/1637; G06F 2203/04102; G06F 1/1641; G09G 3/035; G09G 2380/02; G09G 2300/0426; G09F 9/301; H10K 77/10; H10K 77/111; H10K 2102/311; H10K 59/131; H10K 50/844; H10K 59/80; H01B 7/04; H01B 7/08
See application file for complete search history.

(56) References Cited

U.S. PATENT DOCUMENTS

| | | | |
|---|---|---|---|
| 9,760,125 B2 | 9/2017 | Kim et al. | |
| 10,777,101 B2 | 9/2020 | Park | |
| 10,886,339 B2 | 1/2021 | Won et al. | |
| 2016/0357052 A1* | 12/2016 | Kim | H10K 50/84 |
| 2020/0006397 A1* | 1/2020 | Park | H01L 27/1244 |
| 2022/0050321 A1* | 2/2022 | Park | H05K 1/118 |
| 2022/0066521 A1* | 3/2022 | Jia | H01B 7/04 |
| 2022/0183174 A1* | 6/2022 | Bae | G06F 1/1641 |
| 2022/0343807 A1* | 10/2022 | Lee | G09F 9/301 |
| 2023/0005999 A1* | 1/2023 | Son | H10K 59/40 |

FOREIGN PATENT DOCUMENTS

| | | |
|---|---|---|
| CN | 209150099 U | 7/2019 |
| KR | 10-2019-0128025 A | 11/2019 |
| KR | 10-2076666 B1 | 2/2020 |
| KR | 10-2020-0053991 A | 5/2020 |
| KR | 10-2294345 B1 | 8/2021 |

* cited by examiner

*Primary Examiner* — Xuemei Zheng
(74) *Attorney, Agent, or Firm* — Lewis Roca Rothgerber Christie LLP

(57) ABSTRACT

A display apparatus includes a substrate having a first area, a second area, and a bending area between the first area and the second area, a display element in the first area, a mesh layer overlapping the bending area, and defining opening portions including a first opening portion and a second opening portion, which have different respective sizes, and a bending protective layer on the mesh layer.

20 Claims, 11 Drawing Sheets

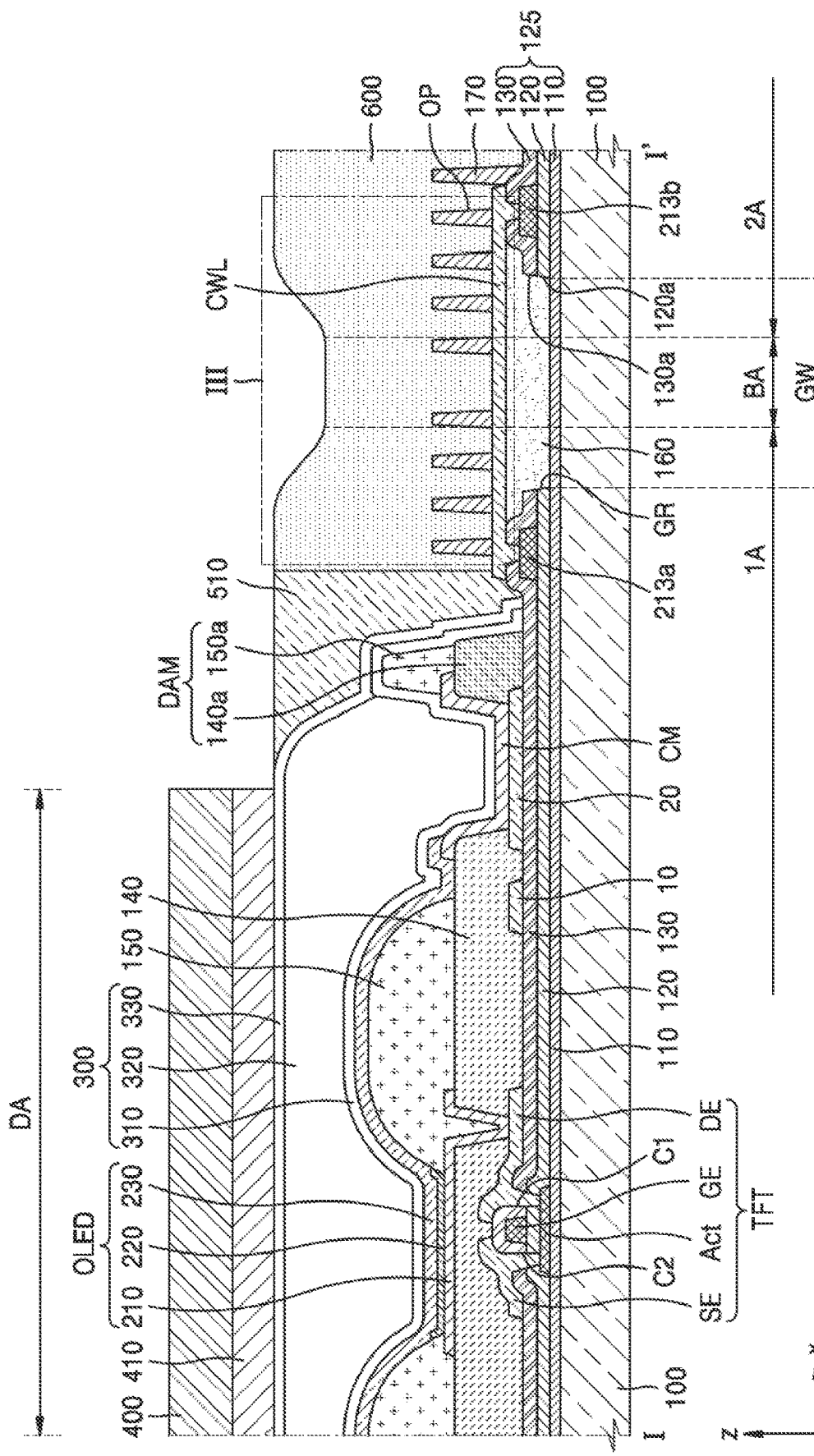

DISPLAY APPARATUS

CROSS-REFERENCE TO RELATED APPLICATION

This application claims priority to, and the benefit of, Korean Patent Application No. 10-2022-0051656, filed on Apr. 26, 2022 in the Korean Intellectual Property Office, the disclosure of which is incorporated by reference herein in its entirety.

BACKGROUND

1. Field

One or more embodiments relate to a display apparatus that may reduce or prevent cracks and/or driving failures that may occur in various members in a bending area of the display apparatus.

2. Description of the Related Art

A display apparatus is an apparatus for visually displaying data. Such a display apparatus includes a substrate divided into a display area and a non-display area. A plurality of pixel areas are defined in the display area. In addition, a thin-film transistor and a pixel electrode electrically connected to the thin-film transistor are included in the display area, wherein the thin-film transistor and the pixel electrode correspond to each of the plurality of pixel areas. Various conductive layers, such as lines configured to transmit electrical signals to the display area, are included in the non-display area.

By bending at least a portion of such a display apparatus, visibility at various angles of the display apparatus may be improved, or the area of the non-display area may be reduced. In an operation of manufacturing a bent display apparatus, as described above, a method of reducing or minimizing defects has been sought.

SUMMARY

One or more embodiments include a display apparatus that may reduce or prevent cracks and/or driving failures that may occur in various members in a bending area of the display apparatus by controlling the thickness of a bending protective layer in the display apparatus having the bending area.

Additional aspects will be set forth in part in the description that follows and, in part, will be apparent from the description, or may be learned by practice of the presented embodiments of the disclosure.

According to one or more embodiments, a display apparatus includes a substrate having a first area, a second area, and a bending area between the first area and the second area, a display element in the first area, a mesh layer overlapping the bending area, and defining opening portions including a first opening portion and a second opening portion, which have different respective sizes, and a bending protective layer on the mesh layer.

The mesh layer may extend to the first area and the second area, wherein the first opening portion is in the bending area, and wherein the second opening portion is in the first area and/or the second area.

A first width of the first opening portion may be about 1.5 times to about 3.5 times greater than a second width of the second opening portion.

A first width of the first opening portion may range from about 80 μm to about 120 μm, wherein a second width of the second opening portion ranges from about 30 μm to about 70 μm.

A first thickness of the bending protective layer on the first opening portion may be less than a second thickness of the bending protective layer on the second opening portion.

The first opening portion or the second opening portion may have a quadrangular shape.

The first opening portion may have a flaked shape, wherein the second opening portion has an irregular shape.

The mesh layer may include a same material as the bending protective layer.

A thickness of the mesh layer may be less than a thickness of the bending protective layer.

The bending protective layer may fill at least a portion of the opening portions.

The display apparatus may further include a connection line below the mesh layer, and extending from the first area to the second area via the bending area, and an inorganic insulating layer between the substrate and the connection line, and defining an opening or a groove corresponding to the bending area.

The display apparatus may further include an organic material layer between the inorganic insulating layer and the connection line, and filling the opening or the groove of the inorganic insulating layer.

The display apparatus may further include a panel driving unit in the second area, and spaced apart from the bending protective layer.

According to one or more embodiments, a display apparatus includes a substrate having a first area, a second area, and a bending area between the first area and the second area, a display element in the first area, a mesh layer overlapping the bending area, and defining opening portions, and a bending protective layer on the mesh layer, and filling at least a portion of the opening portions.

The opening portions may include a first opening portion in the bending area, and having a first opening area, and a second opening portion in the first area and/or the second area, and having a second opening area that is less than the first opening area.

A first thickness of the bending protective layer on the first opening portion may be less than a second thickness of the bending protective layer on the second opening portion.

A thickness of the mesh layer may be less than a thickness of the bending protective layer.

The mesh layer may include a same material as the bending protective layer.

The opening portions may have an irregular shape.

The first opening portion may have a different shape than the second opening portion.

BRIEF DESCRIPTION OF THE DRAWINGS

The above and other aspects of certain embodiments of the disclosure will be more apparent from the following description taken in conjunction with the accompanying drawings, in which:

FIG. 4 is a portion of a cross-sectional view of the display apparatus taken along the line I-I' of FIG. 3;

DETAILED DESCRIPTION

Figure 1:
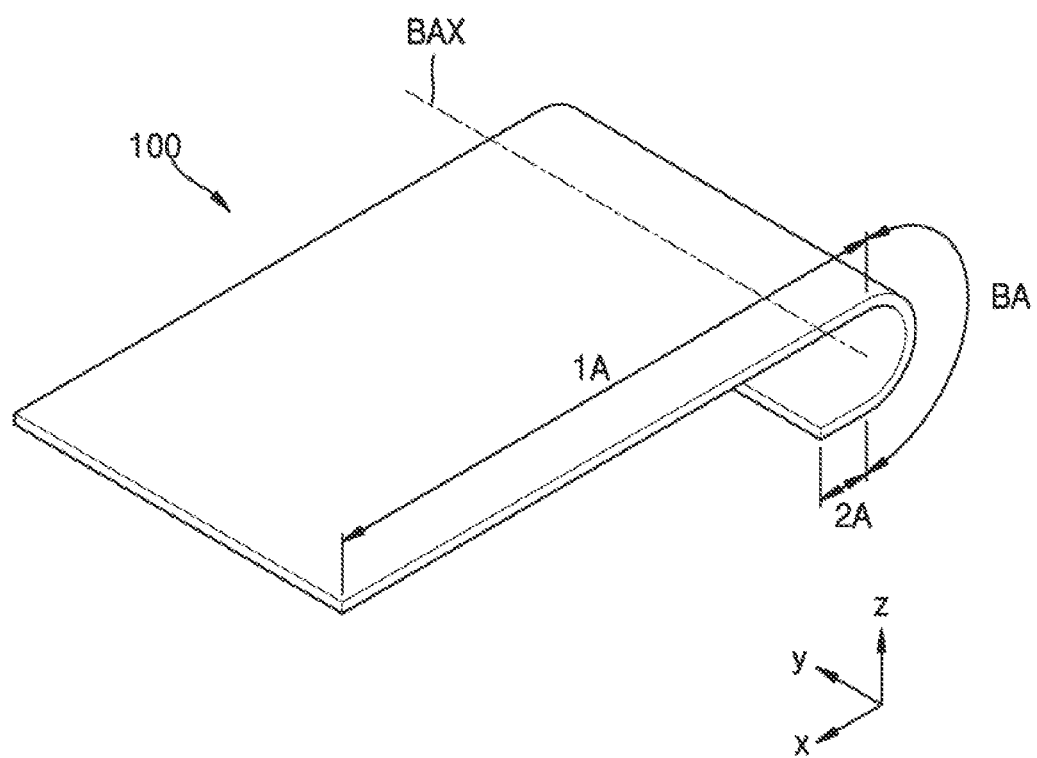
FIG. 1 is a schematic perspective view of a portion of a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display apparatus display an image, and may include a liquid crystal display apparatus, an electrophoretic display apparatus, an organic light-emitting display apparatus, an inorganic light-emitting (EL) display apparatus, a field emission display apparatus, a surface-conduction electron-emitter display apparatus, a plasma display apparatus, a cathode ray display apparatus, or the like.

Hereinafter, although an organic light-emitting display apparatus is described as an example of a display apparatus according to one or more embodiments, the display apparatus of the present disclosure is not limited thereto, and various types of display apparatuses may be used.

Figure 2:
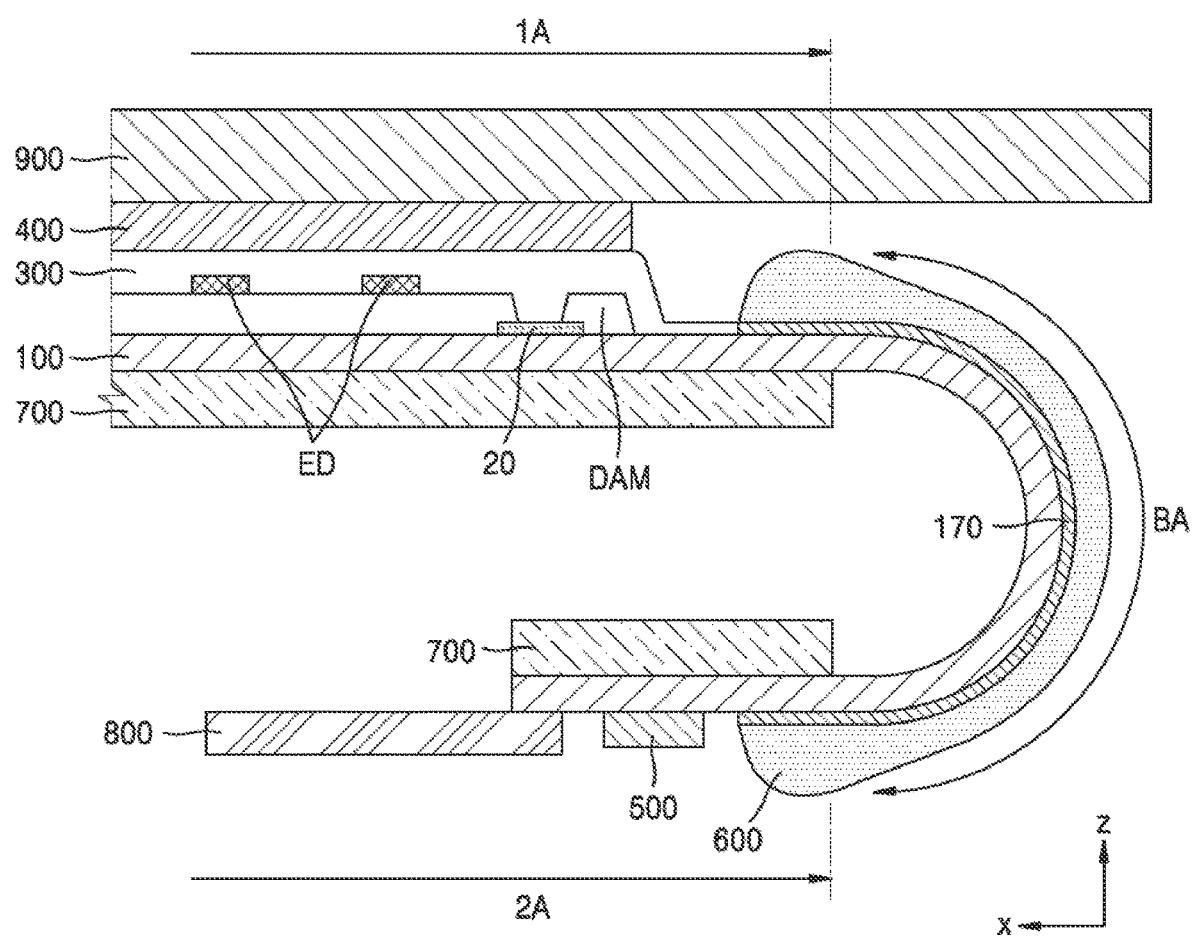
FIG. 2 is a schematic cross-sectional view of a portion of the display apparatus of FIG. 1.

FIG. 1 is a schematic perspective view of a portion of a display apparatus according to one or more embodiments. FIG. 2 is a schematic cross-sectional view of a portion of the display apparatus of FIG. 1.

In the display apparatus according to one or more embodiments as shown in FIG. 1, a portion of a substrate 100, which is a portion of the display apparatus, is bent such that a portion of the display apparatus has a bent shape like the substrate 100.

As shown in FIGS. 1 and 2, the substrate 100 of the display apparatus according to one or more embodiments has a bending area BA extending in a first direction (+y direction). The bending area BA may be between a first area 1A and a second area 2A in a second direction (+x direction), wherein the second direction intersects with the first direction. For example, as shown in FIG. 1, the substrate 100 may be bent around a bending axis BAX extending in the first direction (+y direction). Although FIG. 1 illustrates that the substrate 100 is bent with the same radius of curvature with respect to the bending axis BAX, the present disclosure is not limited thereto. The substrate 100 may be bent with non-uniform radii of curvature with respect to the bending axis BAX.

The substrate 100 may include various materials that are flexible or bendable, and for example, may include a polymer resin, such as polyethersulfone (PES), polyacrylate (PAR), polyetherimide (PEI), polyethylene naphthalate (PEN), polyphenylene sulfide (PPS), polyarylate, polyimide (PI), or cellulose acetate propionate (CAP). The substrate 100 may have a single-layered structure or a multi-layered structure, and may further include an inorganic layer in the case of a multi-layered structure.

Referring to FIG. 2, the display apparatus according to one or more embodiments may include the substrate 100 including the first area 1A, the second area 2A, and the bending area BA therebetween. The display apparatus may also include a plurality of display elements ED and a thin-film encapsulation layer 300 in the first area 1A, a panel driving unit 500 in the second area 2A, a mesh layer 170 overlapping the bending area BA and having/defining a plurality of opening portions (see FIG. 4), and a bending protective layer 600 located on the mesh layer 170.

Figure 3:
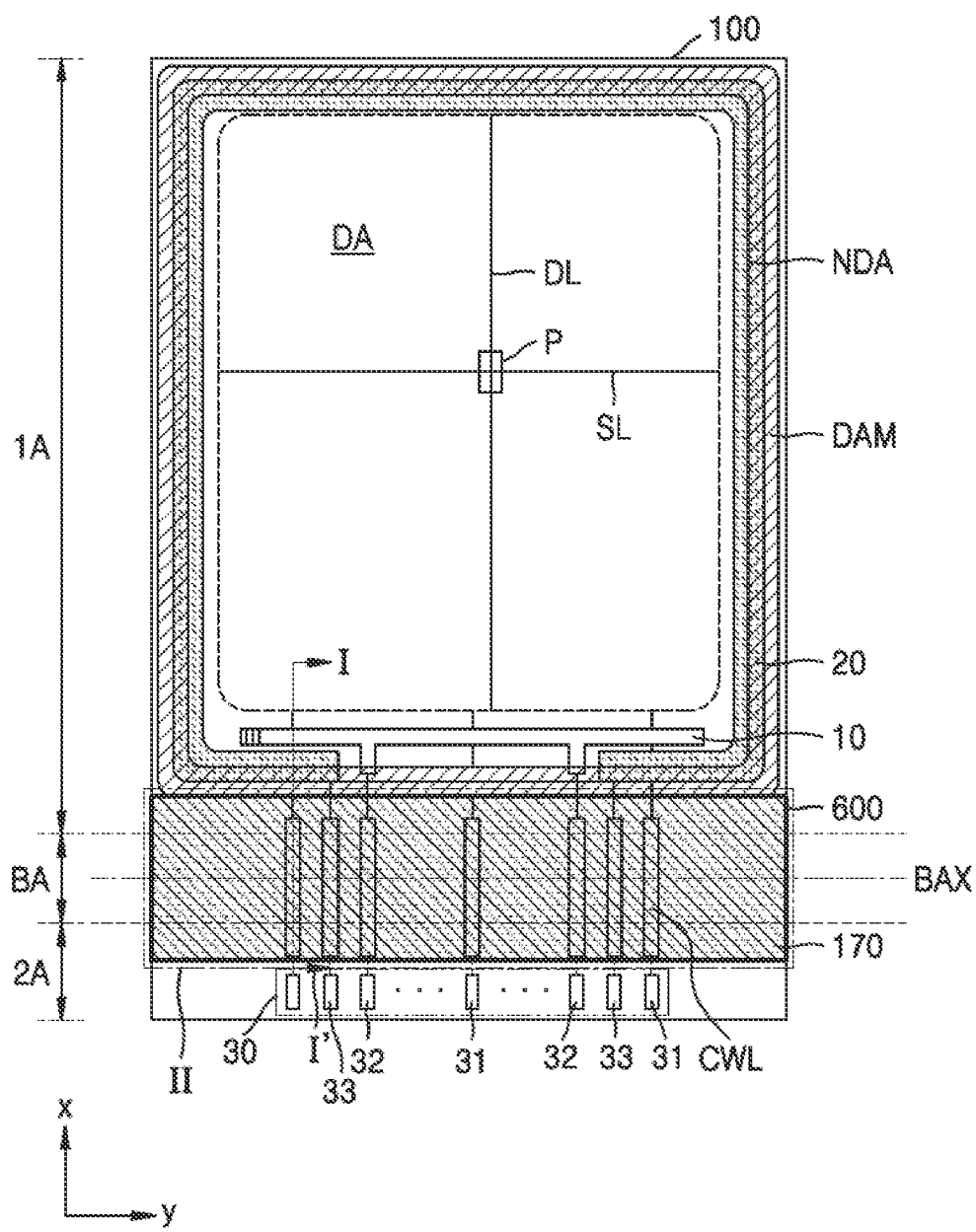
FIG. 3 is a schematic plan view of a portion of a display apparatus according to one or more embodiments.

The first area 1A includes a display area DA (refer to FIG. 3). The first area 1A includes a non-display area NDA (refer to FIG. 3) outside the display area DA, in addition to the display area DA.

The plurality of display elements ED may be arranged in the display area DA of the substrate 100, and an image may be implemented by emission of the plurality of display elements ED. The plurality of display elements ED may include organic light-emitting diodes, inorganic light-emitting diodes, or the like. The thin-film encapsulation layer 300 may be located on the plurality of display elements ED. The thin-film encapsulation layer 300 is configured to protect the plurality of display elements ED from external air, and the thin-film encapsulation layer 300 may include at least one inorganic encapsulation layer and at least one organic encapsulation layer.

A dam DAM may be in the non-display area NDA of the first area 1A. The dam DAM may be formed by protruding from an upper surface of the substrate 100. The dam DAM may be configured to control the flow of an organic material when the at least one organic encapsulation layer of the thin-film encapsulation layer 300 is formed. The dam DAM may overlap at least a portion of the thin-film encapsulation layer 300. A common power line 20 for supplying a common voltage to the display area DA may be in the non-display area NDA. The dam DAM may at least partially overlap the common power line 20.

In the first area 1A, a polarizing film 400 may be located on the thin-film encapsulation layer 300. The polarizing film 400 may reduce the reflectance of light (external light) incident from the outside toward the display apparatus. An adhesive layer may be between the polarizing film 400 and the thin-film encapsulation layer 300. The adhesive layer may include a transparent adhesive layer. For example, the adhesive layer may include an optical clear adhesive (OCA). However, the present disclosure is not limited thereto. The adhesive layer may also include an optically clear resin (OCR). In addition, in one or more other embodiments, the adhesive layer may include a pressure-sensitive adhesive (PSA). The PSA may include a polymer cured product. The PSA may include an acrylic or rubber adhesive, or an adhesive containing fine particles, such as zirconium, in the acrylic or rubber adhesive. In one or more embodiments, the display apparatus may not include the polarizing film 400, and may include, instead of the polarizing film 400, a filter plate including a black matrix and color filters.

A window member 900 may be located on the polarizing film 400. The window member 900 may be provided on an end of the display apparatus that provides a display surface to a user, and may protect components therebelow. An optically-transparent adhesive layer may be between the window member 900 and the polarizing film 400. The window member 900 may be arranged to correspond to each of the display area DA and the non-display area NDA of the first area 1A, and to the bending area BA of the substrate 100.

The panel driving unit 500 may be in the second area 2A. The panel driving unit 500 may be connected to a pad unit of the substrate 100 to supply a data signal and a scan signal to a data line and to a gate line, respectively. The panel driving unit 500 may be arranged to be spaced apart from the bending protective layer 600. For example, the panel driving unit 500 may be a driver integrated circuit (IC), and may be mounted above the pad unit of the substrate 100. In this case, the pad unit may be electrically connected directly to the driver IC.

As one or more other embodiments, a flexible printed circuit board 800 may also be mounted above the pad unit of the substrate 100, and the driver IC may be mounted above the flexible printed circuit board 800. A chip on film (COF) or a flexible printed circuit (FPC) may be applied to the flexible printed circuit board 800, and a driver IC, which is for supplying a signal for causing the plurality of display elements ED in the display area DA to emit light, may be mounted above the flexible printed circuit board 800. Various modifications are possible, for example, both of the panel driving unit 500 and the flexible printed circuit board 800 may be arranged in the second area 2A.

A connection line CWL (refer to FIG. 3) and the bending protective layer 600 located above the connection line CWL may be in the bending area BA of the substrate 100. The connection line CWL may be configured to transmit a signal provided by the panel driving unit 500 and/or the flexible printed circuit board 800 to the display area DA of the first area 1A. The bending protective layer 600 may be configured to protect the connection line CWL, and may be a stress neutralization layer.

When a stacked body is bent, a stress neutral plane exists in the stacked body. When the bending protective layer 600 does not exist, excessive tensile stress or the like may be applied to the connection line CWL that may be arranged in the bending area BA, according to the bending of the substrate 100 or the like. This is because the position of the connection line CWL may not correspond to the stress neutral plane. However, the position of the stress neutral plane in a stacked body including all of the substrate 100, the connection line CWL, and the bending protective layer 600 may be adjusted by including the bending protective layer 600 and by adjusting the thickness and modulus of the bending protective layer 600. Accordingly, as the stress neutral plane is made to be positioned around lines through the bending protective layer 600, the tensile stress applied to the connection line CWL may be reduced or minimized.

The mesh layer 170 having/defining a plurality of opening portions may be located on the connection line CWL, and the bending protective layer 600 may be located on the mesh layer 170. Unlike that shown in FIG. 2, the mesh layer 170 may be arranged in a greater area than the bending protective layer 600. Functions of the mesh layer 170 are described below.

Meanwhile, the substrate 100 may have one surface, and another surface on the opposite side of the one surface, and the plurality of display elements ED may be on the one surface of the substrate 100. A protective film 700 may be on the other surface of the substrate 100, the other surface being opposite to the one surface on which the plurality of display elements ED are positioned. The protective film 700 may be attached to the other surface of the substrate 100 to protect the display apparatus.

In one or more embodiments, the protective film 700 may be attached to the other surface of the substrate 100 through an adhesive layer. The protective film 700 may be in the first area 1A and the second area 2A of the substrate 100, and may not be in the bending area BA. As one or more other embodiments, the protective film 700 may be on an entire surface of the other surface of the substrate 100, that is, the protective film 700 may be in the first area 1A, the second area 2A, and the bending area BA.

FIG. 3 is a schematic plan view of a portion of a display apparatus according to one or more embodiments. For convenience of illustration, FIG. 3 illustrates a display apparatus in an unbent state.

The first area 1A of the substrate 100 includes the display area DA and the non-display area NDA around the display area DA.

A plurality of pixels P may be in the display area DA of the substrate 100 to display an image. The display area DA may include a device, such as a thin-film transistor TFT (refer to FIG. 4), a display element, such as an organic light-emitting device OLED (refer to FIG. 4), a capacitor Cst, or the like.

The display area DA may further include signal lines, such as a scan line SL configured to transmit a scan signal, a data line DL configured to transmit a data signal, a driving power line and a common power line, which are configured to transmit power, or the like, and a pixel P may be formed by electrical coupling of the scan line SL, the data line DL, a thin-film transistor connected to the driving power line, a capacitor, an organic light-emitting device, or the like to display an image. The pixel P may emit light with a brightness corresponding to a driving current passing through an organic light-emitting device in response to a data signal, according to driving power and to common power supplied to the pixel P. The signal lines may be connected to a controller connected to a pad unit 30 through the connection line CWL of the non-display area. The plurality of pixels P may be included, and the plurality of pixels P may be arranged in various forms, such as a stripe arrangement, a PENTILE™ arrangement (e.g., a RGBG arrangement or a PENTILE™ matrix structure, PENTILE™ being a registered trademark of Samsung Display Co., Ltd., Republic of Korea), or the like.

The pad unit 30, a driving power line 10, the common power line 20, and the connection line CWL may be in the non-display area NDA. In addition, in one or more embodiments, a gate driving unit, a data driving unit, or the like may be further arranged in the non-display area NDA.

The pad unit 30 is arranged at one end portion of the non-display area NDA and includes a plurality of terminals 31, 32, and 33. The pad unit 30 may be exposed without being covered by an insulating layer, and may be electrically connected to a controller, such as a flexible printed circuit board, a driver IC, or the like. The controller provides a data signal, a scan signal, a driving voltage, a common voltage, or the like.

The driving power line 10 may be connected to the controller through the driving terminal 32, and may provide a driving voltage ELVDD provided by the controller to the plurality of pixels P. The driving power line 10 may be in the non-display area NDA to correspond to one side surface of the display area DA. Lines for supplying data or scan signals to the display area DA are formed to intersect with the driving power line 10. In this case, the connection line CWL may be connected to the lines by, or via, a contact hole.

The common power line 20 may be connected to the controller through the common terminal 33, and may provide a common voltage provided by the controller to the plurality of pixels P. The common power line 20 may be arranged in the non-display area NDA to at least partially surround the display area DA. The common power line 20 may also extend along sides of the display area DA other than a side of the display area DA that is adjacent to the driving power line 10.

The dam DAM may be arranged in the non-display area NDA to at least partially surround the display area DA. As shown in FIG. 3, the dam DAM may be arranged to continuously surround the display area DA. However, the present disclosure is not limited thereto. The dam DAM may be arranged to partially surround the display area DA, and various modifications are possible, for example, the dam DAM may be arranged to surround the display area DA in a shape as shown by a dotted line.

The dam DAM may be arranged to at least partially overlap the common power line 20. In some embodiments, the dam DAM may be arranged to cover an outer edge of the common power line 20. In some embodiments, an inner dam arranged on the side of the display area DA to be apart from the dam DAM and/or an outer dam arranged on the side of an edge of the substrate 100 may be further included.

At least one connection line CWL may be in the bending area BA. In this case, the connection line CWL may extend from the first area 1A to the second area 2A via the bending area BA. The at least one connection line CWL may extend to intersect with the bending axis BAX. For example, the at least one connection line CWL may extend perpendicularly to the bending axis BAX, but the present disclosure is not limited thereto. Various modifications are possible, for example, the connection line CWL may obliquely extend at a given angle with the bending axis BAX. In addition, the connection line CWL may have various shapes, such as a curved shape, a zigzag shape, or the like, instead of a straight-line shape. The connection line CWL may be connected to lines arranged in different layers through a contact hole.

The mesh layer 170 located on the connection line CWL and having/defining a plurality of opening portions may be in the bending area BA, and the bending protective layer 600 may be arranged to cover the mesh layer 170.

FIG. 4 is a portion of a cross-sectional view of the display apparatus taken along the line I-I' of FIG. 3. FIG. 4 illustrates the display apparatus in an unbent state.

FIG. 4 illustrates that the organic light-emitting device OLED is in the display area DA as a display element. The organic light-emitting device OLED being electrically connected to the thin-film transistor TFT may be understood as that a pixel electrode 210 of the organic light-emitting device OLED is electrically connected to the thin-film transistor TFT. In one or more embodiments, thin-film transistor may also be arranged in a peripheral area outside the display area DA of the substrate 100 when suitable. The thin-film transistor in the peripheral area may be, for example, a portion of a circuit unit for controlling an electrical signal applied to the display area DA.

The thin-film transistor TFT may include a semiconductor layer Act including amorphous silicon, polycrystalline silicon, an oxide semiconductor material, or an organic semiconductor material, a gate electrode GE, a source electrode SE, and a drain electrode DE.

The gate electrode GE may be connected to a gate line that applies an on/off signal to the thin-film transistor TFT, and may include a low-resistance metal material. For example, the gate electrode GE may be a single film or a multi-layered film, each including a conductive material including molybdenum (Mo), aluminum (Al), copper (Cu), and/or titanium (Ti), or the like.

The source electrode SE and the drain electrode DE may be a single film or a multi-layered film, each including a conductive material having good conductivity, and may respectively be connected to a source area and a drain area of the semiconductor layer Act. For example, the source electrode SE and the drain electrode DE may be a single film or a multi-layered film, each including a conductive material including Al, Cu, and/or Ti, or the like.

The source electrode SE and the drain electrode DE may be connected to the semiconductor layer Act through contact holes C2 and C1, respectively. The contact holes C1 and C2 may be formed by concurrently or substantially simultaneously etching an interlayer insulating layer 130 and a gate insulating layer 120.

The thin-film transistor TFT according to one or more embodiments is a top-gate type in which the gate electrode GE is located above the semiconductor layer Act, but the present disclosure is not limited thereto. The thin-film transistor TFT according to one or more other embodiments may be a bottom-gate type in which the gate electrode GE is located below the semiconductor layer Act.

To secure insulation between the semiconductor layer Act and the gate electrode GE, the gate insulating layer 120 including an inorganic material, such as silicon oxide, silicon nitride, and/or silicon oxynitride, or the like, may be between the semiconductor layer Act and the gate electrode GE. The interlayer insulating layer 130 including an inorganic material, such as silicon oxide, silicon nitride, and/or silicon oxynitride, or the like, may be located on the gate electrode GE, and the source electrode SE and the drain electrode DE may be located on the interlayer insulating layer 130. As described above, and for example, an insulating layer including an inorganic material may be formed through chemical vapor deposition (CVD) or through atomic layer deposition (ALD). The above description is similar to the embodiments, and modified examples thereof will be described below.

A buffer layer 110 including an inorganic material, such as silicon oxide, silicon nitride, and/or silicon oxynitride, or the like, may be between the thin-film transistor TFT and the substrate 100. The buffer layer 110 may increase the smoothness of an upper surface of the substrate 100 to reduce, prevent, or minimize penetration of impurities from the substrate 100 or the like into the semiconductor layer Act of the thin-film transistor TFT. The buffer layer 110 may include an inorganic material, such as an oxide or a nitride, an organic material, or an organic and inorganic composite, and may include a single-layered structure or a multi-layered structure, each including an inorganic material and an organic material. In some embodiments, the buffer layer 110 may be a triple-layered structure of silicon oxide/silicon nitride/silicon oxide.

Also, a planarization layer 140 may be located on the thin-film transistor TFT. For example, as shown in FIG. 4, when the organic light-emitting device OLED is located above the thin-film transistor TFT, the planarization layer 140 may substantially planarize an upper portion of a protective film covering the thin-film transistor TFT. The planarization layer 140 may include, for example, an organic material, such as acryl, benzocyclobutene (BCB), hexamethyldisiloxane (HMDSO), or the like. Although FIG. 4 illustrates the planarization layer 140 as a single layer, various modifications are possible, for example, the planarization layer 140 may be a multi-layered film.

In addition, as shown in FIG. 4, the planarization layer 140 may also have/define an opening outside the display area DA to allow a portion of the planarization layer 140 in the display area DA and a portion of the planarization layer 140 in the second area 2A to be physically separated. This is to reduce or prevent impurities penetrating from the outside from reaching the inside of the display area DA through the inside of the planarization layer 140.

In the display area DA of the substrate 100, the organic light-emitting device OLED including the pixel electrode 210, an opposite electrode 230, and an intermediate layer 220 positioned therebetween and including an emission layer may be located on the planarization layer 140.

The pixel electrode 210 may contact any one of the source electrode SE and the drain electrode DE through an opening portion formed in the planarization layer 140 or the like to be electrically connected to the thin-film transistor TFT. The pixel electrode 210 may include a reflective film including silver (Ag), magnesium (Mg), Al, platinum (Pt), palladium (Pd), gold (Au), nickel (Ni), neodymium (Nd), iridium (Ir), chrome (Cr), or a compound thereof, and a transparent or semi-transparent electrode layer on the reflective film. The transparent or semi-transparent electrode layer may include at least one selected from a group including indium tin oxide (ITO), indium zinc oxide (IZO), a zinc oxide (ZnO), an indium oxide ($In_2O_3$), an indium gallium oxide (IGO), and an aluminum oxide (AZO). In some embodiments, the pixel electrode 210 may include a structure in which ITO/Ag/ITO are stacked.

A pixel defining layer 150 may be located on the planarization layer 140. The pixel defining layer 150 defines a pixel by having/defining an opening corresponding to each of sub-pixels, that is, an opening through which at least a central portion of the pixel electrode 210 is exposed. In addition, the pixel defining layer 150 may reduce or prevent the likelihood of an arc or the like being generated at an edge of the pixel electrode 210 by increasing a distance between the edge of the pixel electrode 210 and the opposite electrode 230 above the pixel electrode 210. The pixel defining layer 150 may include, for example, an organic material, such as polyimide, HMDSO, or the like.

The intermediate layer 220 of the organic light-emitting device OLED may include a low-molecular-weight material or a polymer material. When the intermediate layer 220 includes a low-molecular-weight material, the intermediate layer 220 may have a structure in which a hole injection layer (HIL), a hole transport layer (HTL), an emission layer (EML), an electron transport layer (ETL), an electron injection layer (EIL), or the like are stacked in a single or complex structure, and may include various organic materials including copper phthalocyanine (CuPc), N,N'-Di (naphthalene-1-yl)-N,N'-diphenyl-benzidine (NPB), tris-8-hydroxyquinoline aluminum ($Alq_3$), or the like. The layers of the intermediate layer 220 may be formed by a method of vacuum deposition.

When the intermediate layer 220 includes a polymer material, the intermediate layer 220 may have a structure including the HTL and the EML. The HTL may include poly(3,4-ethylenedioxythiophene) (PEDOT), and the EML may include a polymer material, such as a poly(p-phenylene vinylene) (PPV)-based polymer material, a polyfluorene-based polymer material, or the like. The intermediate layer 220 may be formed by a screen-printing method, an inkjet printing method, a laser induced thermal imaging (LITI) method, or the like.

The intermediate layer 220 is not limited thereto, and may have various structures. Also, the intermediate layer 220 may include a single-body layer over a plurality of pixel electrodes 210, or may include a layer patterned to correspond to each of the plurality of pixel electrodes 210.

The opposite electrode 230 may be located on the intermediate layer 220. The opposite electrode 230 may be a transparent electrode or a reflective electrode. In some embodiments, the opposite electrode 230 may be a transparent or a semi-transparent electrode, and include a metal thin film having a low work function and including lithium (Li), calcium (Ca), lithium-fluoride-calcium (LiF/Ca), lithium-fluoride-aluminum (LiF/Al), Al, Ag, Mg, and a compound thereof. In addition, a transparent conductive oxide (TCO) film, such as ITO, IZO, ZnO, or $In_2O_3$, may be further located on the metal thin film. The opposite electrode 230 may be integrally formed over a plurality of organic light-emitting devices OLED to correspond to the plurality of pixel electrodes 210.

Because the organic light-emitting device OLED may be easily damaged by moisture or oxygen from the outside, the thin-film encapsulation layer 300 may cover the organic light-emitting device OLED to protect the organic light-emitting device OLED. The thin-film encapsulation layer 300 may cover the display area DA, and may extend to the outside of the display area DA. The thin-film encapsulation layer 300 may include a first inorganic encapsulation layer 310, an organic encapsulation layer 320, and a second inorganic encapsulation layer 330.

The first inorganic encapsulation layer 310 may cover the opposite electrode 230, and may include silicon oxide, silicon nitride, and/or silicon oxynitride. Other layers, such as a capping layer or the like, may be between the first inorganic encapsulation layer 310 and the opposite electrode 230 when suitable. Because the first inorganic encapsulation layer 310 is formed along an underlying structure, an upper surface of the first inorganic encapsulation layer 310 may not be flat. The organic encapsulation layer 320 covers the first inorganic encapsulation layer 310, and unlike the first inorganic encapsulation layer 310, an upper surface of the organic encapsulation layer 320 may be formed substantially flat. In detail, the organic encapsulation layer 320 may have a substantially flat upper surface in a portion thereof corresponding to the display area DA. The organic encapsulation layer 320 may include one or more materials selected from a group including polyethylene terephthalate, polyethylene naphthalate, polycarbonate, polyimide, polyethylene sulfonate, polyoxymethylene, polyarylate, and HMDSO. The second inorganic encapsulation layer 330 may cover the organic encapsulation layer 320, and may include silicon oxide, silicon nitride, and/or silicon oxynitride, or the like. The second inorganic encapsulation layer 330 may be in contact with the first inorganic encapsulation layer 310 at an edge of the second inorganic encapsulation layer 330, the edge being positioned outside the display area DA, so that exposure of the organic encapsulation layer 320 may be reduced or prevented.

As described above, the thin-film encapsulation layer 300 includes the first inorganic encapsulation layer 310, the organic encapsulation layer 320, and the second inorganic encapsulation layer 330. Even when cracks occur in the thin-film encapsulation layer 300, such cracks may not be connected between the first inorganic encapsulation layer 310 and the organic encapsulation layer 320, or between the organic encapsulation layer 320 and the second inorganic encapsulation layer 330, due to a multi-layered structure of the thin-film encapsulation layer 300. Accordingly, the formation of a path, through which external moisture or oxygen, or the like penetrates into the display area DA, may be reduced, prevented, or minimized.

The dam DAM may be arranged in the non-display area NDA outside the display area DA to control the flow of an organic material when the organic encapsulation layer 320 is formed. The dam DAM may include a first layer 140a that includes the same material as that of the planarization layer 140 and that is positioned on the same layer as the planarization layer 140, and a second layer 150a that includes the same material as that of the pixel defining layer 150 and that is positioned on the first layer 140a. The dam DAM may include an organic insulating material, such as polyimide, polyamide, acrylic resin, BCB, HMDSO, phenol resin, or the like. The dam DAM may include a photosensitive organic material. The dam DAM may be arranged to be apart from the planarization layer 140 and the pixel defining layer 150. At one side of the dam DAM, the first inorganic encapsulation layer 310 and the second inorganic encapsulation layer 330 may contact each other.

The driving power line 10 and the common power line 20 may be in the non-display area NDA. The driving power line 10 and the common power line 20 may be lines for respectively supplying a driving voltage and a common voltage to a pixel circuit in the display area DA. The driving power line 10 and the common power line 20 may each be located on the interlayer insulating layer 130. In some embodiments, the common power line 20 may be connected to the opposite electrode 230 of the organic light-emitting device OLED to transmit a common voltage. The dam DAM may be arranged to at least partially overlap the common power line 20. The dam DAM may cover an edge area of the common power line 20, the edge area being far from the display area DA. An edge area of the common power line 20 that is adjacent to the display area DA may be covered by the planarization layer 140. As described above, as the edge areas of the common power line 20 are covered by the dam DAM and the planarization layer 140, the common power line 20 may be protected from damage that may occur during an operation of manufacturing the display apparatus.

FIG. 4 illustrates an example in which the common power line 20 is connected to the opposite electrode 230 by a connection conductive layer CM. In some embodiments, the connection conductive layer CM may extend to an upper surface of the first layer 140a of the dam DAM. However, the present disclosure is not limited thereto, and various modifications are possible, for example, the common power line 20 may directly contact the opposite electrode 230.

In some embodiments, the connection conductive layer CM may be concurrently or substantially simultaneously formed with the pixel electrode 210, and may include the same material as that of the pixel electrode 210. The connection conductive layer CM may include Ag, Mg, Al, Pt, Pd, Au, Ni, Nd, Ir, Cr, and the transparent or semi-transparent electrode layer may include at least one selected from a group including ITO, IZO, ZnO, $In_2O_3$, IGO, and AZO.

The polarizing film 400 may be adhered to the thin-film encapsulation layer 300 through an OCA 410. The polarizing film 400 may reduce reflection of external light. For example, when external light passes through the polarizing film 400 to be reflected from an upper surface of the opposite electrode 230 and then passes through the polarizing film 400 again, the phase of the external light may be changed as the external light passes through the polarizing film 400 twice. As a result, destructive interference is generated by making the phase of reflected light different from the phase of the external light entering the polarizing film 400, and as a result, visibility of the display apparatus may be improved by reducing external light reflection. The OCA 410 and the polarizing film 400 may overlap a portion of the non-display area NDA in addition to the display area DA. For example, the polarizing film 400 may overlap the dam DAM.

The display apparatus according to one or more embodiments does not always include the polarizing film 400, and the polarizing film 400 may also be omitted or replaced with other components, when suitable, in other embodiments. For example, the polarizing film 400 may be omitted, and external light reflection may be reduced by using a black matrix and a color filter.

The buffer layer 110, the gate insulating layer 120, and the interlayer insulating layer 130, each including an inorganic material, may be collectively referred to as an inorganic insulating layer 125. The inorganic insulating layer 125 may be between the substrate 100 and the connection line CWL. The inorganic insulating layer 125 may have/define a groove GR corresponding to the bending area BA. The groove GR may mean an area in which a portion of the inorganic insulating layer 125 is partially removed in a downward direction (−z direction) and in which a portion of the inorganic insulating layer 125 remains. For example, the buffer layer 110 may be continuous over the first area 1A, the bending area BA, and the second area 2A. Also, the gate insulating layer 120 may have/define an opening 120a corresponding to the bending area BA, and the interlayer insulating layer 130 may have/define an opening 130a corresponding to the bending area BA. Accordingly, the inorganic insulating layer 125 including the buffer layer 110, the gate insulating layer 120, and the interlayer insulating layer 130 may be understood to have the groove GR corresponding to the bending area BA. The inorganic insulating layer 125 may also include the groove GR in various different shapes. For example, a portion of an upper surface (+z direction) of the buffer layer 110 may also be removed. Unlike the above case, various modifications are possible, for example, a lower surface (−z direction) of the gate insulating layer 120 may also remain without being removed.

The groove GR corresponding to the bending area BA may be understood as overlapping the bending area BA. At this time, an area of the groove GR may be greater than an area of the bending area BA. To this end, FIG. 4 illustrates that a width GW of the groove GR may be greater than a width of the bending area BA. Here, the area of the groove GR may be defined as an area of an opening having the narrowest area among the openings 120a and 130a of the gate insulating layer 120 and the interlayer insulating layer 130.

As described above, in the display apparatus according to one or more embodiments, an organic material layer 160 may be between the inorganic insulating layer 125 and the connection line CWL, and the organic material layer 160 may fill at least a portion of the groove GR. That is, the organic material layer 160 may overlap the bending area BA. The organic material layer 160 may extend to a portion of a non-bending area.

In addition, the display apparatus according to one or more embodiments has the connection line CWL, which extends from the first area 1A to the second area 2A via the bending area BA. The connection line CWL may be located above the organic material layer 160. In a position where the organic material layer 160 does not exist, the connection line CWL may be positioned on the inorganic insulating layer 125 (e.g., on the interlayer insulating layer 130). The connection line CWL may function as a line configured to transmit electrical signals to the display area DA, and the connection line CWL may be concurrently or substantially simultaneously formed with the source electrode SE or the drain electrode DE, and may include the same material as that of the source electrode SE or the drain electrode DE.

As described above, FIG. 4 illustrates the display apparatus in an unbent state for convenience, but the display apparatus according to one or more embodiments is, in actuality, in a state in which the substrate 100 or the like is bent in the bending area BA, as shown in FIG. 1. To this end, in an operation of manufacturing the display apparatus, the display apparatus is manufactured in a state in which the substrate 100 is approximately flat as shown in FIG. 4, and then the substrate 100 or the like is bent in the bending area BA, so that the display apparatus has a shape approximately as shown in FIG. 1. At this time, although a tensile stress may be applied to the connection line CWL in an operation in which the substrate 100 or the like is bent in the bending area BA, in the display apparatus according to one or more embodiments, occurrence of defects in the connection line CWL may be reduced, prevented, or minimized during such a bending operation.

When the inorganic insulating layer 125 does not have the groove GR in the bending area BA, and instead has a continuous shape from the first area 1A to the second area 2A, and when the connection line CWL is positioned on the inorganic insulating layer 125, a large tensile stress may be applied to the connection line CWL in an operation while the substrate 100 or the like is bent. For example, because the inorganic insulating layer 125 has a greater hardness than that of an organic material layer, there is a very high probability that cracks will occur in the inorganic insulating layer 125 in the bending area BA. When cracks occur in the inorganic insulating layer 125, cracks or the like are generated in the connection line CWL on the inorganic insulating layer 125, so that the probability of occurrence of defects, such as disconnection of the connection line CWL or the like, is relatively high.

However, in the display apparatus according to one or more embodiments, as described above, the inorganic insulating layer 125 has the groove GR in the bending area BA, and a portion of the connection line CWL in the bending area BA is positioned on the organic material layer 160 filling at least a portion of the groove GR of the inorganic insulating layer 125. Because the inorganic insulating layer 125 has the groove GR in the bending area BA, the probability of occurrence of cracks in the inorganic insulating layer 125 is extremely low, and in the case of the organic material layer 160, the probability of occurrence of cracks is low due to the characteristic of including an organic material. Accordingly, occurrence of cracks or the like in a portion of the connection line CWL in the bending area BA, the connection line CWL being positioned on the organic material layer 160, may be reduced or prevented, or the probability thereof may be reduced or minimized. Because the hardness of the organic material layer 160 is less than that of an inorganic material layer, the organic material layer 160 absorbs a tensile stress caused by bending of the substrate 100 or the like, so that the concentration of tensile stress on the connection line CWL may be effectively reduced or minimized.

The display apparatus according to one or more embodiments may include conductive layers 213a and 213b connected to the connection line CWL, in addition to the connection line CWL. The conductive layers 213a and 213b may be in the first area 1A and/or the second area 2A to be positioned on a different layer from a layer on which the connection line CWL is positioned, and may be electrically connected to the connection line CWL. FIG. 4 illustrates that each of the conductive layers 213a and 213b includes the same material as that of the gate electrode GE of the thin-film transistor TFT, and is positioned on the same layer as the gate electrode GE of the thin-film transistor TFT, that is, on the gate insulating layer 120. Also, FIG. 4 illustrates that the connection line CWL contacts each of the conductive layers 213a and 213b through a contact hole formed in the interlayer insulating layer 130. In addition, FIG. 4 illustrates that the conductive layer 213a is in the first area 1A, and the conductive layer 213b is in the second area 2A.

The conductive layer 213 in the first area 1A may be electrically connected to the thin-film transistor TFT or the like in the display area DA, and accordingly, the connection line CWL may be electrically connected to the thin-film transistor TFT or the like in the display area DA through the conductive layer 213a. The conductive layer 213b in the second area 2A may also be electrically connected to the thin-film transistor TFT or the like in the display area DA by the connection line CWL. As such, the conductive layers 213a and 213b may be outside the display area DA while being electrically connected to components in the display area DA, or may be outside the display area DA while extending in a direction of the display area DA, so that at least a portion of each of the conductive layers 213a and 213b may be in the display area DA.

As the connection line CWL intersecting with the bending area BA includes a material having high elongation, defects such as cracks in the connection line CWL or disconnection of the connection line CWL may be reduced or prevented. In addition, in the first area 1A and/or the second area 2A, each of the conductive layers 213a and 213b includes a material having lower elongation than that of the connection line CWL and also having different electrical/physical properties from those of the connection line CWL, so that, in the display apparatus, efficiency of electric signal transmission may be increased, or the occurrence rate of defects in a manufacturing operation may be reduced. For example, the conductive layers 213a and 213b may each include molybdenum, and the connection line CWL may include aluminum. The connection line CWL or the conductive layers 213a and 213b may have a multi-layered structure when suitable.

In the case of the conductive layer 213b in the second area 2A, at least a portion of an upper portion thereof may be exposed to the outside without being covered by the planarization layer 140, so that the conductive layer 213b may be connected to various electronic devices or printed circuit boards, or the like.

The bending protective layer 600 may be located on the connection line CWL in the bending area BA. The bending protective layer 600 may be in the bending area BA, and may extend to the first area 1A and the second area 2A around the bending area BA. The bending protective layer 600 may relieve excessive tensile stress applied to the connection line CWL according to the bending of the substrate 100 or the like. The bending protective layer 600 may include a material, such as Cr, CrOx, Cr/CrOx, Cr/CrOx/CrNy, a resin (carbon pigment, red-green-blue (RGB)-mixed pigment), graphite, a non-Cr-based material, an acrylic material, or the like. The bending protective layer 600 may be formed by coating a liquid or paste-type material and curing the material. A thickness of the bending protective layer 600 may range from about 60 μm to about 140 μm.

When the bending protective layer 600 in the bending area BA is relatively thick, and a thickness thereof is irregularly formed, cracks in lines, glass, or the like near the bending area BA and driving failures may occur due to lifting of the bending protective layer 600. The thickness of the bending protective layer 600 may be difficult to control due to the phenomenon that, when a material for forming the bending protective layer 600 is coated, the coated material may flow and may be driven to a particular portion.

In one or more embodiments, as the mesh layer 170 is included below the bending protective layer 600, the thickness of the bending protective layer 600 may be controlled. That is, occurrence of cracks in various members in the bending area BA may be reduced or prevented by maintaining a relatively thin and constant thickness of the bending protective layer 600 in the bending area BA.

The mesh layer 170 may be between the connection line CWL and the bending protective layer 600. The mesh layer 170 may be in the bending area BA, and may extend to the first area 1A and the second area 2A on respective sides of the bending area BA. The mesh layer 170 may have a plurality of opening portions OP.

A thickness of the mesh layer 170 may be less than a thickness of the bending protective layer 600. For example, the thickness of the mesh layer 170 may range from about 5% to about 20% of the thickness of the bending protective layer 600. The thickness of the mesh layer 170 may range from about 8 μm to about 12 μm.

The mesh layer 170 may include the same material as that of the bending protective layer 600, and may be combined with the bending protective layer 600. The mesh layer 170 may include an acrylic material. The mesh layer 170 may be melted by a material for forming the bending protective layer 600. In some embodiments, a portion of the mesh layer 170 may be melted and combined with the bending protective layer 600.

The bending protective layer 600 may be manufactured by coating a liquid or paste-type material on the mesh layer 170, and by curing the material. The bending protective layer 600 may fill at least a portion of the plurality of opening portions OP of the mesh layer 170.

In addition, in the display apparatus of one or more embodiments, touch electrodes of various patterns for a touch screen function may be on the thin-film encapsulation layer 300, and a touch protective layer covering the touch electrode may be arranged to protect the touch electrode. In addition, the display apparatus may further include the protective film 700 (see FIG. 2) that protects a lower surface (−z direction) of the substrate 100. In this case, the protective film 700 may include an opening corresponding to the bending area BA.

Figure 5A:
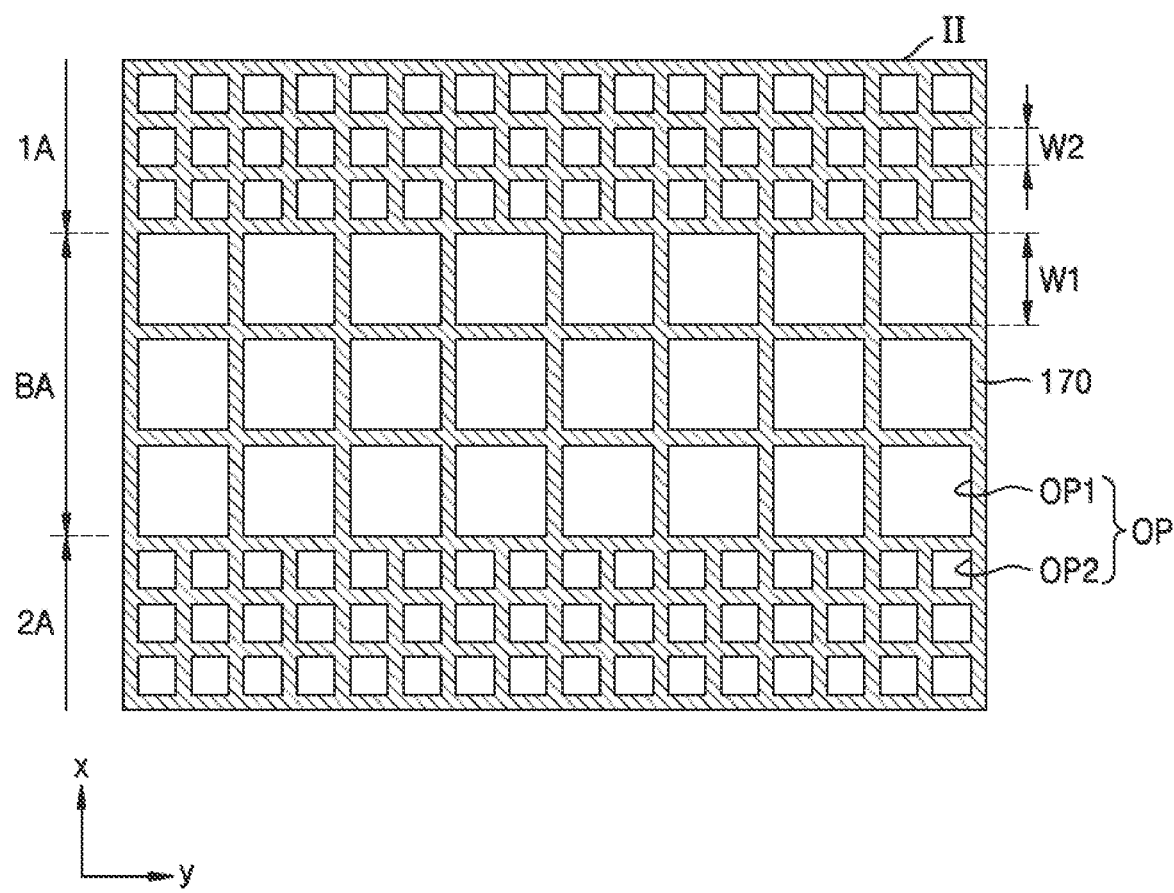
FIG. 5A is an enlarged view of a mesh layer that may be arranged in the area II of FIG. 3.
Figure 5B:
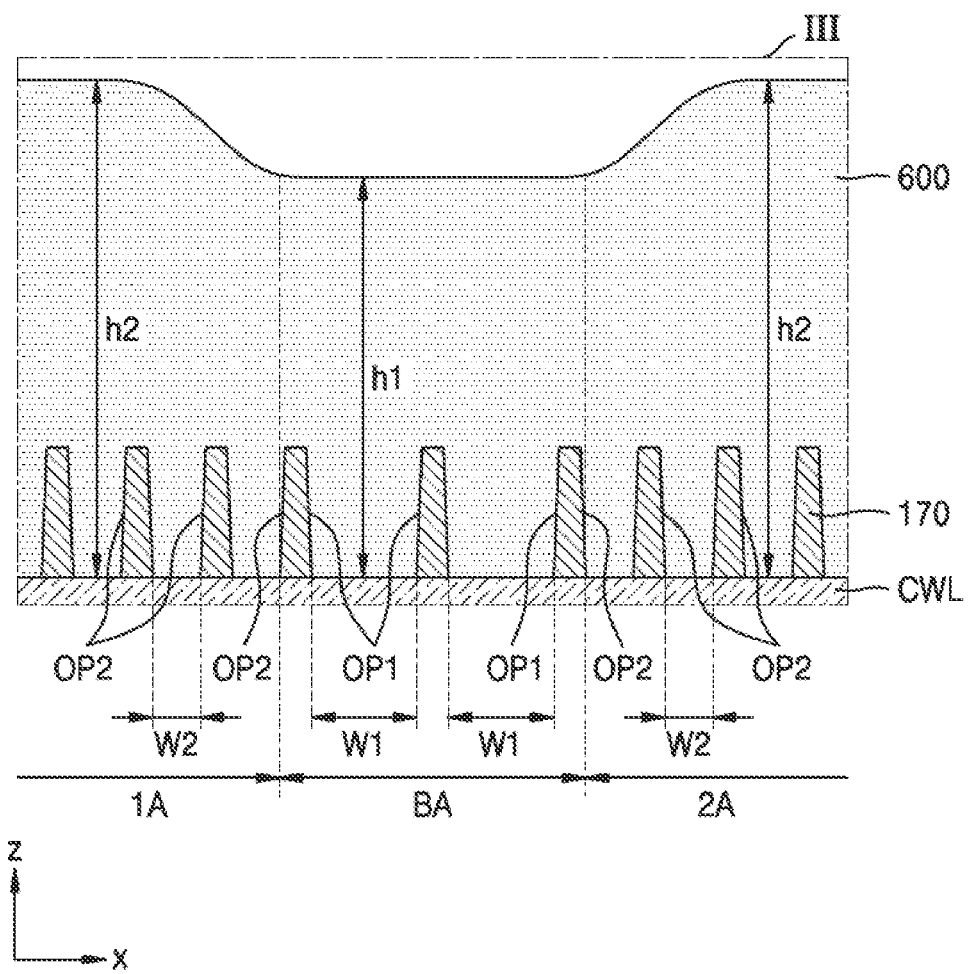
FIGS. 5B, 5C, and 6 are schematic enlarged views each corresponding to the area III of FIG. 4.

FIG. 5A is an enlarged view of the mesh layer 170 in the area II of FIG. 3, and FIG. 5B is an enlarged view the area III of FIG. 4.

Referring to FIG. 5A, the display apparatus according to one or more embodiments may include the mesh layer 170 having/defining a plurality of opening portions OP including first and second opening portions OP1 and OP2, which have different respective sizes. A size of each of the plurality of opening portions OP may be defined by a width of each of the plurality of opening portions OP. The width of each of the plurality of opening portions OP means a width in a direction perpendicularly intersecting with the bending axis BAX.

The mesh layer 170 may extend to the first area 1A and the second area 2A on respective sides of the bending area BA as a center. The mesh layer 170 may include the plurality of opening portions OP, and the plurality of opening portions OP may include the first opening portion OP1 and the second opening portion OP2. The first opening portion OP1 may be in the bending area BA, and the second opening portion OP2 may be in the first area 1A and/or the second area 2A.

A first width W1 of the first opening portion OP1 may be greater than a second width W2 of the second opening portion OP2. The first width W1 may be in a range from about 1.5 times to about 3.5 times the second width W2. The first width W1 may range from about 80 μm to about 120 μm, and the second width W2 may range from about 30 μm to about 70 μm.

Referring to FIG. 5B, the mesh layer 170 may be located on the connection line CWL, and the bending protective layer 600 may be located on the mesh layer 170. When the bending protective layer 600 is formed to be relatively thick in the bending area BA, cracks and driving failures may occur due to the lifting of the bending protective layer 600. In the present disclosure, as the bending protective layer 600 is located on the mesh layer 170 overlapping the bending area BA and having the plurality of opening portions OP, a thickness of the bending protective layer 600 may be controlled.

In one or more embodiments, the thickness of the bending protective layer 600 may be controlled by differentiating the sizes of the plurality of opening portions OP in the mesh layer 170. This is because, when a solution for forming the bending protective layer 600 is coated, in an area having a large area of an opening portion, the solution fills the opening portion and widely spreads, and in an area having a small area of an opening portion, the solution gathers together.

The first width W1 of the first opening portion OP1 in the bending area BA may be greater than the second width W2 of the second opening portion OP2, and accordingly, a first thickness h1 of the bending protective layer 600 located on the first opening portion OP1 may be less than a second thickness h2 of the bending protective layer 600 located on the second opening portion OP2. The first thickness h1 of the bending protective layer 600 located on the first opening portion OP1 may be reduced by about 15% to about 25% of the second thickness h2 of the bending protective layer 600 located on the second opening portion OP2. The thickness of the bending protective layer 600 refers to a thickness from the lowermost end of the mesh layer 170 to the uppermost end of the bending protective layer 600.

Figure 5C:
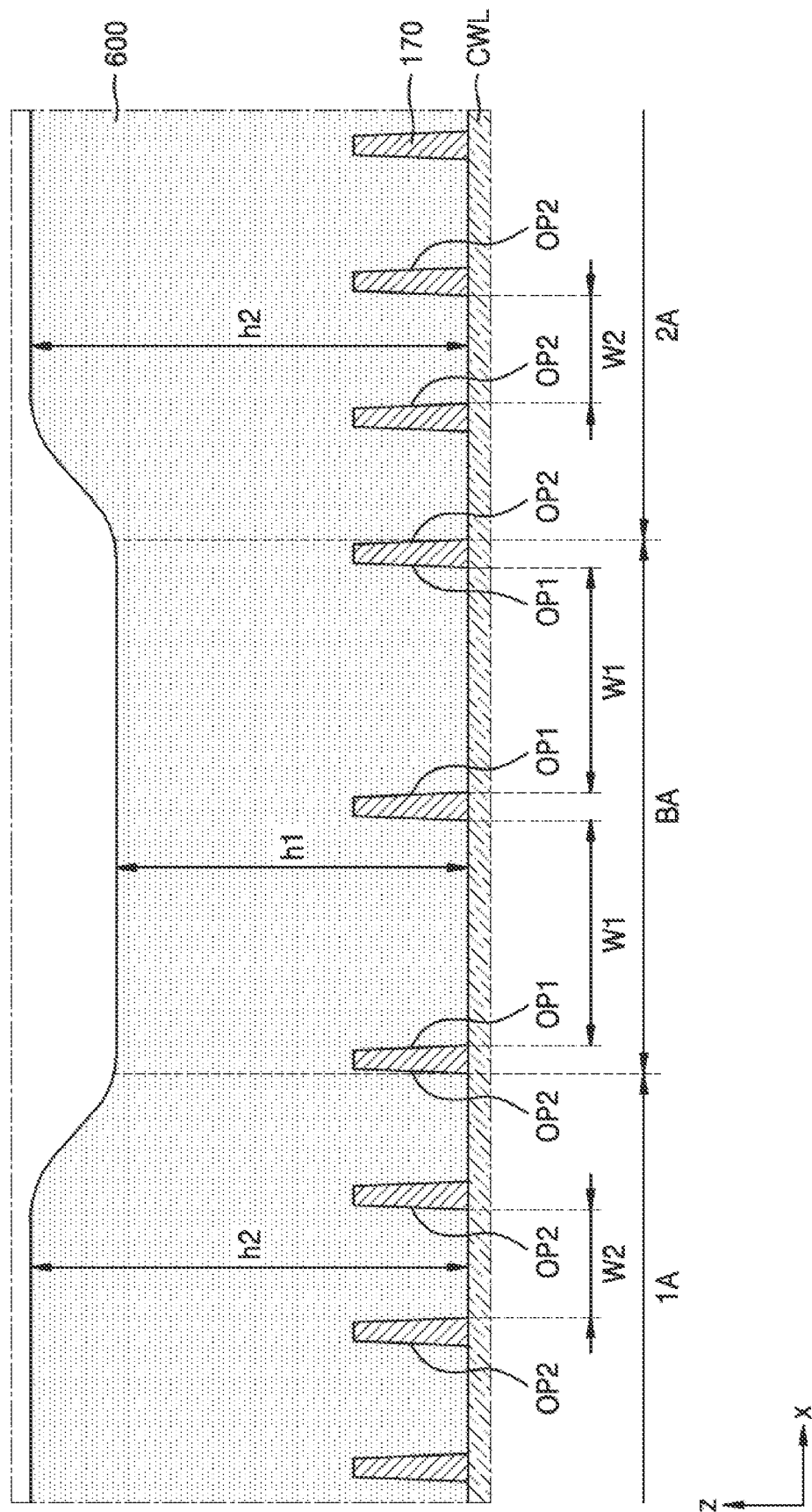

FIG. 5C shows one or more other embodiments. In FIG. 5C, the same reference numerals in FIG. 5B denote the same members.

Referring to FIG. 5C, the first width W1 and the second width W2 of the plurality of opening portions OP including the first and second openings OP1 and OP2 may be greater than the thickness of the mesh layer 170. The first width W1 may range from about 80 μm to about 120 μm, and the second width W2 may range from about 30 μm to about 70 μm. The thickness of the mesh layer 170 may range from about 8 μm to about 12 μm.

FIGS. 5B and 5C each illustrates a case in which the widths of the first opening portion OP1 and the second opening portion OP2 of the mesh layer 170 are constant, but the present disclosure is not limited thereto.

Figure 6:
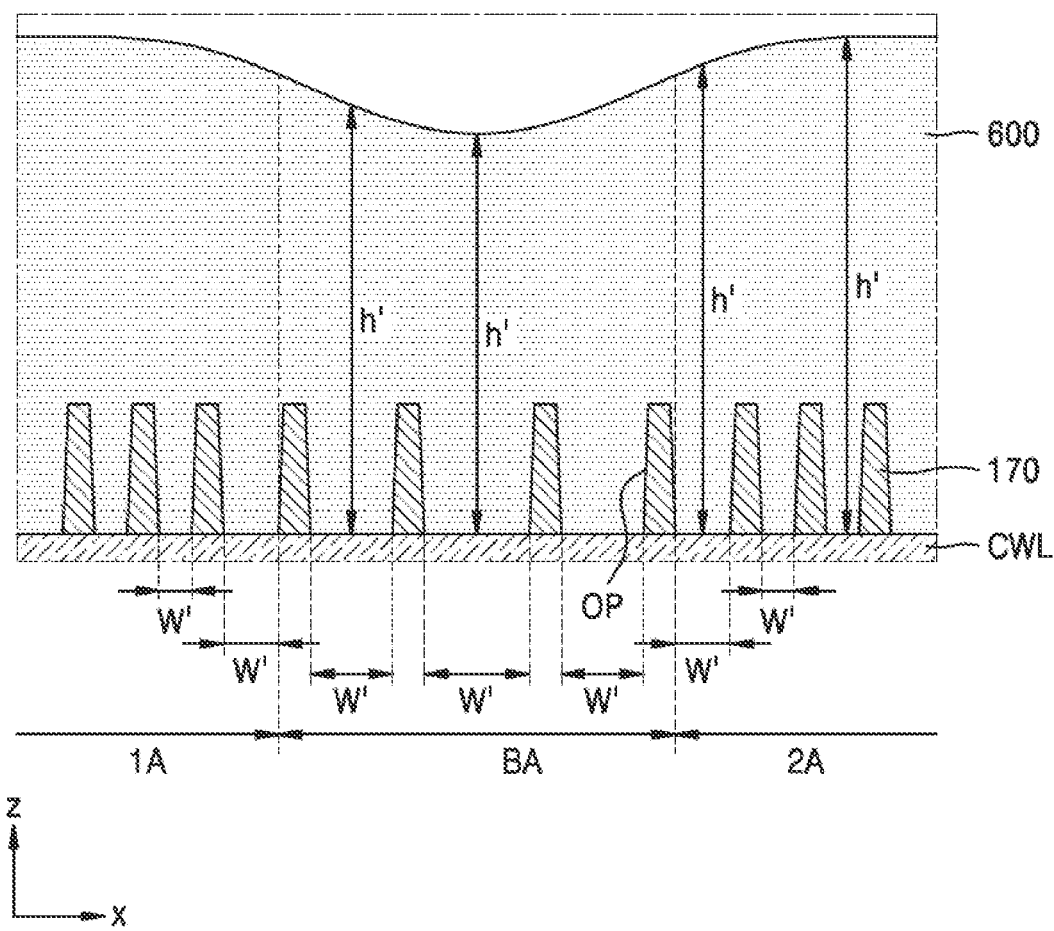

FIG. 6 shows one or more other embodiments. In FIG. 6, the same reference numerals in FIG. 5B denote the same members.

Referring to FIG. 6, the mesh layer 170 may overlap the bending area BA and have a plurality of opening portions OP. The bending protective layer 600 may be located on the mesh layer 170. The plurality of opening portions OP may have different sizes. The bending protective layer 600 may fill at least a portion of the plurality of opening portions OP.

The mesh layer 170 may extend to the first area 1A and the second area 2A on respective sides of the bending area BA as a center thereof. In one or more embodiments, a width W' of the plurality of opening portions OP may gradually change. The width W' of the plurality of opening portions OP may increase (e.g., gradually or incrementally) toward a center of the bending area BA. Accordingly, a thickness h' of the bending protective layer 600 may decrease (e.g., gradually) toward the center of the bending area BA. The width W' of the plurality of opening portions OP may be greater than the thickness of the mesh layer 170.

Figure 7:
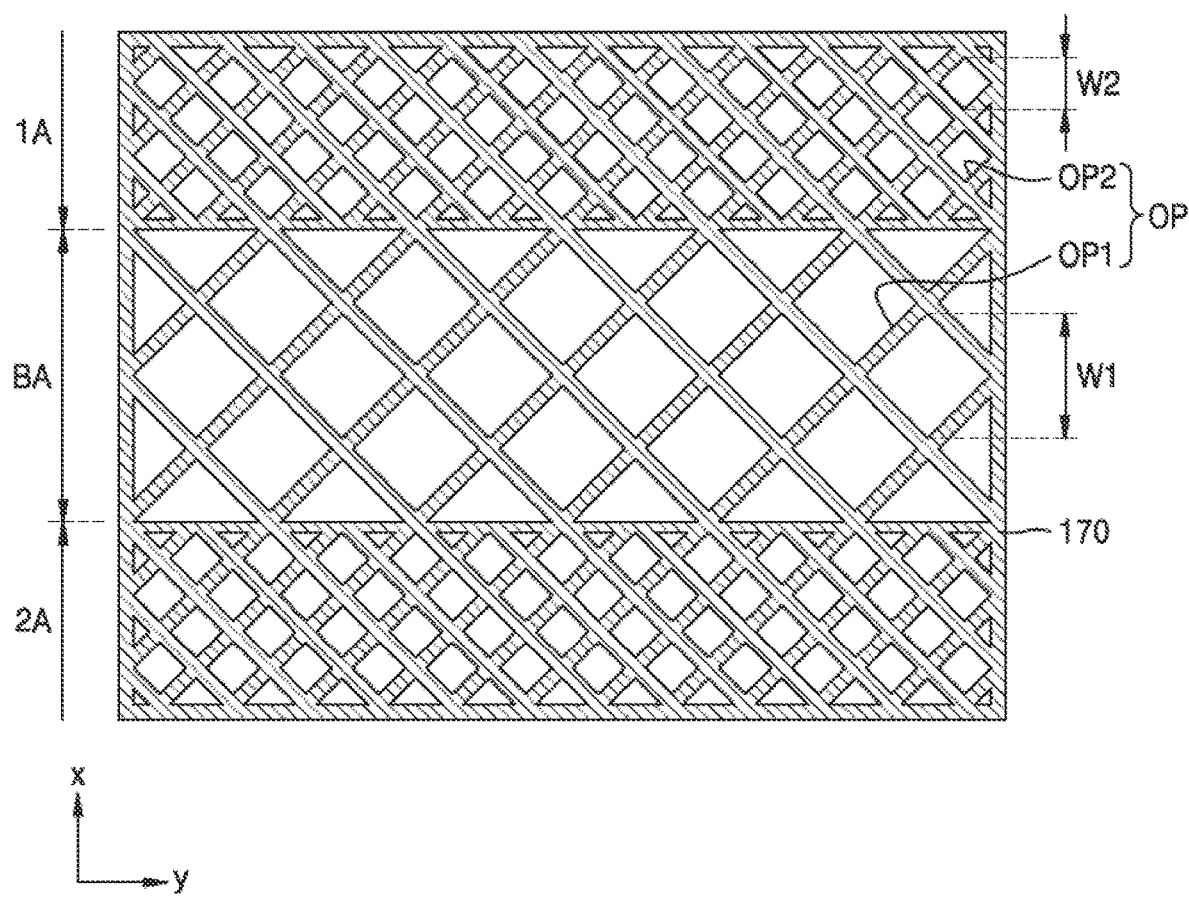
FIG. 7 is a plan view of a mesh layer according to one or more embodiments, which may be included in a display apparatus according to one or more embodiments.

FIG. 7 is a plan view of the mesh layer 170 according to one or more embodiments that may be included in a display apparatus according to one or more embodiments.

The mesh layer 170 according to one or more embodiments may overlap the bending area BA and may have a plurality of opening portions OP. The bending protective layer 600 may be located on the mesh layer 170. The plurality of opening portions OP may have different sizes. The bending protective layer 600 may fill at least a portion of the plurality of opening portions OP.

Referring to FIG. 7, the plurality of opening portions OP of the mesh layer 170 may each have a rhombus shape. The mesh layer 170 may extend to the first area 1A and the second area 2A on respective sides of the bending area BA as a center thereof. The plurality of opening portions OP may have the first opening portion OP1 and the second opening portion OP2. The first opening portion OP1 may be in the bending area BA, and the second opening portion OP2 may be in the first area 1A and/or the second area 2A.

A first width W1 of the first opening portion OP1 may be greater than a second width W2 of the second opening portion OP2. A size of each of the plurality of opening portions OP may be defined by a width of each of the plurality of opening portions OP. The width of each of the plurality of opening portions OP means a width in a direction perpendicularly intersecting with the bending axis BAX.

Figure 8:
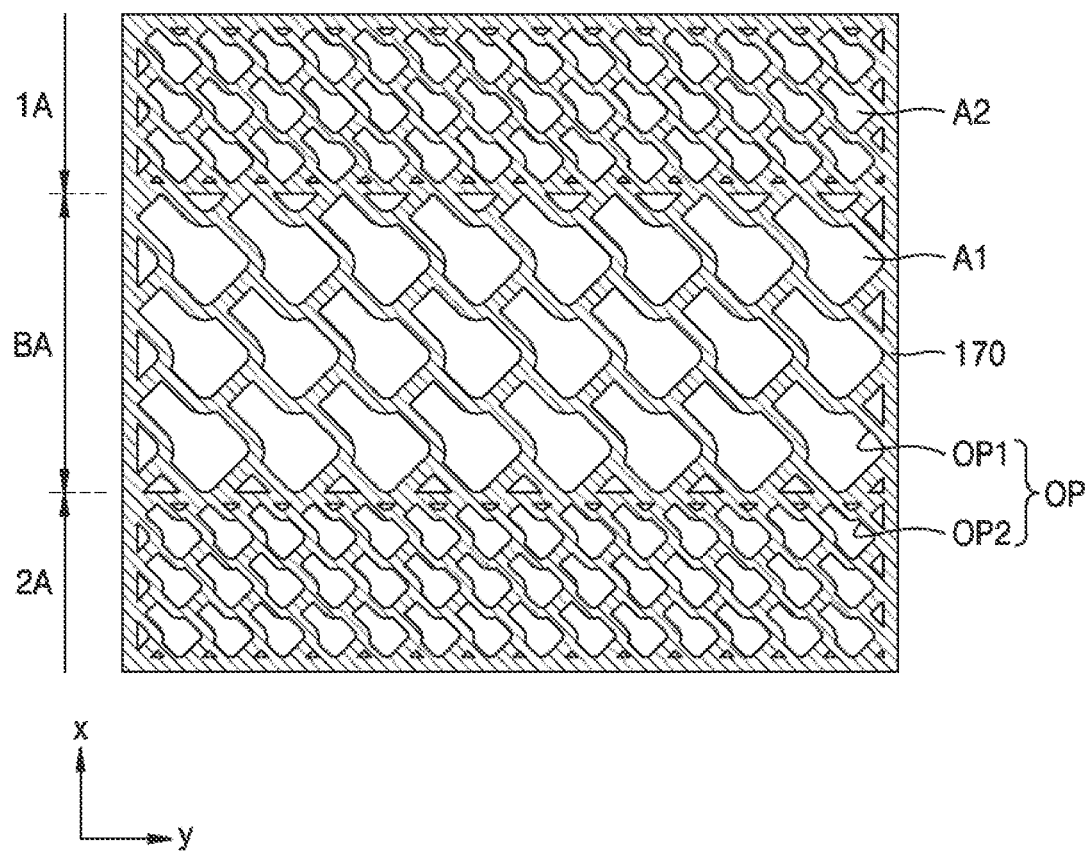
FIG. 8 is a plan view of a mesh layer according to one or more embodiments, which may be included in a display apparatus according to one or more embodiments.

FIG. 8 is a plan view of the mesh layer 170 according to one or more embodiments that may be included in a display apparatus according to one or more embodiments.

The mesh layer 170 according to one or more embodiments may overlap the bending area BA and may have a plurality of opening portions OP. The bending protective layer 600 may be located on the mesh layer 170. The plurality of opening portions OP may have different sizes. The bending protective layer 600 may fill at least a portion of the plurality of opening portions OP.

Referring to FIG. 8, the plurality of opening portions OP of the mesh layer 170 may each have an irregular shape. The mesh layer 170 may extend to the first area 1A and the second area 2A on respective sides of the bending area BA as a center. The plurality of opening portions OP may have the first opening portion OP1 and the second opening portion OP2. The first opening portion OP1 may be in the bending area BA, and the second opening portion OP2 may be in the first area 1A and/or the second area 2A.

A size of each of the plurality of opening portions OP may be defined by an area of each of the plurality of opening portions OP as well as a width of each of the plurality of opening portions OP. In one or more embodiments, a first opening area A1 of the first opening portion OP1 may be greater than a second opening area A2 of the second opening portion OP2.

Figure 9:
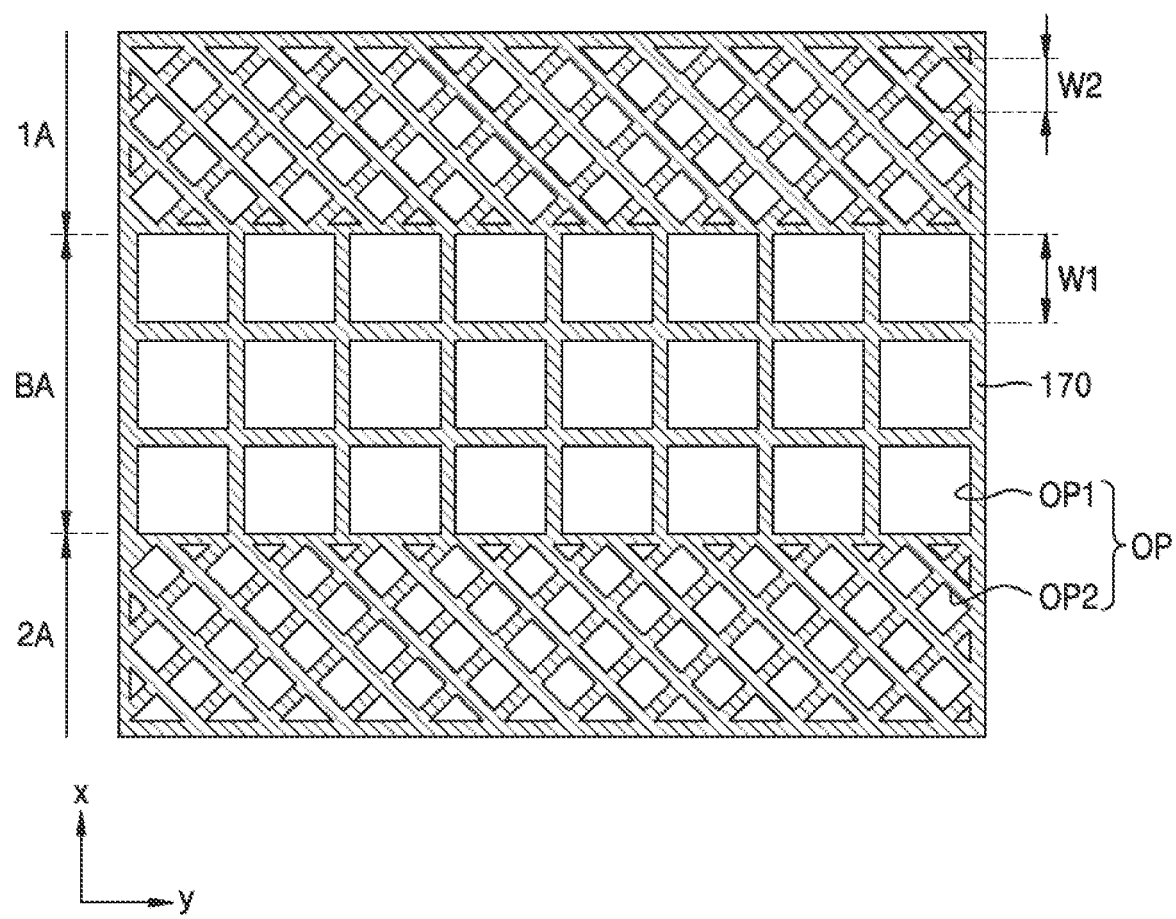
FIG. 9 is a plan view of a mesh layer according to one or more embodiments, which may be included in a display apparatus according to one or more embodiments.

FIG. 9 is a plan view of the mesh layer 170 according to one or more embodiments that may be included in a display apparatus according to one or more embodiments.

The mesh layer 170 according to one or more embodiments may overlap the bending area BA and may have a plurality of opening portions OP. The bending protective layer 600 may be located on the mesh layer 170. The plurality of opening portions OP may have different sizes. The bending protective layer 600 may fill at least a portion of the plurality of opening portions OP.

The mesh layer 170 may extend to the first area 1A and the second area 2A on respective sides of the bending area BA as a center thereof. The plurality of opening portions OP may have the first opening portion OP1 and the second opening portion OP2. The first opening portion OP1 may be in the bending area BA, and the second opening portion OP2 may be in the first area 1A and/or the second area 2A.

Referring to FIG. 9, the first opening portion OP1 in the bending area BA and the second opening portion OP2 in the first area 1A and/or the second area 2A may have different shapes from each other.

FIGS. 7, 8, and 9 show shapes of the plurality of opening portions OP according to embodiments that may be included in the display apparatus according to one or more embodiments, but the shape of the plurality of opening portions OP is not limited thereto. The plurality of opening portions OP may include various shapes, such as a circular shape, a flaked shape, a triangular shape, or the like.

As described above, the display apparatus according to one or more embodiments includes a mesh layer having/defining a plurality of opening portions, and includes a bending protective layer located on the mesh layer, so that cracks and/or driving failures that may occur in various members in a bending area of the display apparatus may be reduced or prevented by controlling the thickness of the bending protective layer.

It should be understood that embodiments described herein should be considered in a descriptive sense only, and not for purposes of limitation. Descriptions of aspects within each embodiment should typically be considered as available for other similar or compatible aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
   a substrate having a first area, a second area, and a bending area between the first area and the second area;
   a display element in the first area;
   a mesh layer overlapping the bending area, and defining opening portions comprising a first opening portion and a second opening portion, which have different respective sizes; and
   a bending protective layer on the mesh layer, and having a first thickness in the bending area, and a second thickness in the first area and in the second area that is greater than the first thickness.

2. The display apparatus of claim 1, wherein the mesh layer extends to the first area and the second area,
   wherein the first opening portion is in the bending area, and
   wherein the second opening portion is in the first area and/or the second area.

3. The display apparatus of claim 2, wherein a first width of the first opening portion is about 1.5 times to about 3.5 times greater than a second width of the second opening portion.

4. The display apparatus of claim 2, wherein a first width of the first opening portion ranges from about 80 μm to about 120 μm, and
   wherein a second width of the second opening portion ranges from about 30 μm to about 70 μm.

5. The display apparatus of claim 2, wherein the bending protective layer has the first thickness on the first opening portion and the second thickness on the second opening portion.

6. The display apparatus of claim 2, wherein the first opening portion or the second opening portion has a quadrangular shape.

7. The display apparatus of claim 2, wherein the first opening portion has a flaked shape, and
   wherein the second opening portion has an irregular shape.

8. The display apparatus of claim 1, wherein the mesh layer comprises a same material as the bending protective layer.

9. The display apparatus of claim 1, wherein a thickness of the mesh layer is less than a thickness of the bending protective layer.

10. The display apparatus of claim 1, wherein the bending protective layer fills at least a portion of the opening portions.

11. The display apparatus of claim 1, further comprising:
    a connection line below the mesh layer, and extending from the first area to the second area via the bending area; and
    an inorganic insulating layer between the substrate and the connection line, and defining an opening or a groove corresponding to the bending area.

12. The display apparatus of claim 11, further comprising an organic material layer between the inorganic insulating layer and the connection line, and filling the opening or the groove of the inorganic insulating layer.

13. The display apparatus of claim 1, further comprising a panel driving unit in the second area, and spaced apart from the bending protective layer.

14. A display apparatus comprising:
a substrate having a first area, a second area, and a bending area between the first area and the second area;
a display element in the first area;
a mesh layer overlapping the bending area, and defining opening portions; and
a bending protective layer on the mesh layer, filling at least a portion of the opening portions, and having a first thickness in the bending area, and a second thickness in the first area and/or the second area that is greater than the first thickness.

15. The display apparatus of claim 14, wherein the opening portions comprise:
a first opening portion in the bending area, and having a first opening area; and
a second opening portion in the first area and/or the second area, and having a second opening area that is less than the first opening area.

16. The display apparatus of claim 15, wherein the bending protective layer has the first thickness on the first opening portion and the second thickness on the second opening portion.

17. The display apparatus of claim 14, wherein a thickness of the mesh layer is less than a thickness of the bending protective layer.

18. The display apparatus of claim 14, wherein the mesh layer comprises a same material as the bending protective layer.

19. A display apparatus comprising:
a substrate having a first area, a second area, and a bending area between the first area and the second area;
a display element in the first area;
a mesh layer overlapping the bending area, and defining opening portions; and
a bending protective layer on the mesh layer, and filling at least a portion of the opening portions,
wherein the opening portions have an irregular shape.

20. The display apparatus of claim 15, wherein the first opening portion has a different shape than the second opening portion.

* * * * *